United States Patent [19]

Kaya

[11] Patent Number: 5,200,919
[45] Date of Patent: Apr. 6, 1993

[54] ELECTRICALLY-ERASABLE, ELECTRICALLY-PROGRAMMABLE READ-ONLY MEMORY CELL WITH A SELECTABLE THRESHOLD VOLTAGE AND METHODS FOR ITS USE

[75] Inventor: Cetin Kaya, Dallas, Tex.

[73] Assignee: Texas Instruments Incorporated, Dallas, Tex.

[21] Appl. No.: 730,566

[22] Filed: Jul. 15, 1991

Related U.S. Application Data

[63] Continuation of Ser. No. 546,066, Jun. 29, 1990, abandoned.

[51] Int. Cl.[5] .............................................. G11C 11/40
[52] U.S. Cl. ............................... 365/185; 365/189.09; 365/218; 257/321; 257/322; 257/369
[58] Field of Search ............... 365/185, 218, 189.09; 357/42, 23.5

[56] References Cited

U.S. PATENT DOCUMENTS

| | | | |
|---|---|---|---|
| 4,595,999 | 6/1986 | Betirac | 365/185 |
| 4,686,558 | 8/1987 | Adam | 357/42 |
| 4,791,317 | 12/1988 | Winnerl et al. | 357/42 |
| 4,797,856 | 1/1989 | Lee et al. | 365/185 |
| 4,798,974 | 1/1989 | Reczek et al. | 357/42 |
| 4,829,203 | 5/1989 | Ashmore | 365/185 |
| 5,043,940 | 8/1991 | Harari | 365/218 |

FOREIGN PATENT DOCUMENTS 60-257563 12/1985 Japan ................................. 365/185

Primary Examiner—Joseph E. Clawson, Jr.
Attorney, Agent, or Firm—Ira S. Matsil; James C. Kesterson; Richard L. Donaldson

[57] ABSTRACT

A field effect transistor memory cell having a selectable threshold voltage is formed in a semiconductor layer (18). An n-channel electrically-erasable, electrically-programmable read-only memory cell (12) is formed and includes a source (14) and a drain (16) separated by a channel (20), a tunneling window (22) adjacent drain (16), a floating gate (24) and a control gate (26) capacitively coupled to channel (20). N-channel memory cell (12) is operable to charge and discharge floating gate (24) by Fowler-Nordheim tunneling upon the application of voltages to control gate (26) and drain (16). A p-channel field effect transistor (30) is formed and includes a source (34) in a drain (36) spaced by a channel (38). Floating gate (24) is insulatively disposed adjacent channel (38) such that the conductance of channel (38) is controlled by floating gate (24). A threshold control circuit (76) is provided for biasing channel (38) of p-channel field effect transistor (30) in relationship to control gate (26). A monitoring circuit (90) controls the application of voltage to control gate (26) in response to conduction between source (34) and drain (36) of p-channel field effect transistor (30).

15 Claims, 3 Drawing Sheets

ELECTRICALLY-ERASABLE, ELECTRICALLY-PROGRAMMABLE READ-ONLY MEMORY CELL WITH A SELECTABLE THRESHOLD VOLTAGE AND METHODS FOR ITS USE

This application is a continuation, of application Ser. No. 546,066, filed Jun. 29, 1990 now abandoned.

TECHNICAL FIELD OF THE INVENTION

The present invention relates generally to memory devices, and more particularly to electrically-erasable, electrically-programmable read-only memories with a selectable threshold voltage and methods for use of such memories.

BACKGROUND OF THE INVENTION

The most widely used electrically-erasable, electrically-programmable, read-only cell is an n-channel field effect transistor with an additional floating gate structure disposed between the channel and the control gate. By charging the floating gate with electrons, a logic "zero" can be programmed into the cell, while allowing the floating gate to remain uncharged programs a logic "one." This is due to the fact that the charge on the floating gate controls the conductance of the underlying channel area, thereby determining whether a current will be sensed between the source and the drain when reading voltages are applied therebetween.

As in the case of the conventional field effect transistor, the channel of a EEPROM cell with an uncharged floating gate (a non-programmed cell) has a threshold voltage $V_t$. This threshold voltage $V_t$ is primarily a function of the material used to form the channel and can be controlled within limits by the implantation of dopants in the channel during the fabrication of the cell. During the read operation, the control gate must be brought to a potential in excess of the threshold voltage $V_t$, as determined by the capacitive coupling between the control gate and the floating gate and floating gate and the channel, in order for current to flow between the source and the drain when a voltage potential is created between them. By charging the floating gate with electrons, however, the threshold voltage $V_t$ can be raised.

One means of effecting the charging of the floating gate is through Fowler-Nordheim tunneling. In the n-channel EEPROM, when the control gate is brought to a sufficiently high potential in relationship to the drain, electrons can be made to tunnel through a thin oxide tunneling region adjacent the drain to the floating gate, thereby charging it. By raising the threshold voltage by charging the floating gate, a logic "zero" is programmed into the cell due to the fact that the normal reading voltage applied to the control gate will not exceed the potential necessary to allow the current flow in the channel as raised by the charged floating gate, and therefore no current can be sensed when proper source and drain reading voltages are applied.

In principle, it is possible to set the threshold voltage of a EEPROM to any value by varying the amount of charge residing on the floating gate. This may be done, for instance, by varying the pulse height, duration and/or the number of pulses used in creating the voltage potential between the control gate and the drain. In practice, however, this is not an easy task. First, the threshold voltage has a logarithmic dependency on pulse duration. Further, this process is very slow, requiring unacceptable expenditures of time to program the cell to extreme values. Additionally, variations from cell to cell, especially due to differences in the tunnel oxides used for Fowler-Nordheim tunneling, create consistency problems during array operation. Finally, trapping of materials in the oxide will change the current-voltage (I-V) characteristics of the tunnel diode over time, which may require frequent calibration cycles to determine the write/erase characteristics of the EEPROM cell.

A self-limiting erase scheme for an EEPROM cell is disclosed in U.S. Pat. No. 4,797,856. This device will allow the floating gate of an EEPROM cell to be erased to a predetermined value, thus controlling the threshold voltage of the cell. This device has a major disadvantage if it is ever desired to set the threshold voltage of an unprogrammed cell. In this case, the floating gate would have to be completely charged, and then erased back to a point where the charge remaining on the floating gate set the threshold voltage of the cell to the desired value.

Thus, a need has arisen for an electrically-erasable read only memory cell in which the threshold voltage of the channel can be set either during the write cycle or the erase cycle. Such a device would be self-controlling, and would minimize the need for precise controlling of the voltage application during the write and erase cycles. Further, this device should be capable of fabrication into an integrated circuit form using conventional techniques Finally, the device should be compatible with the peripheral devices currently used with EEPROM cells.

SUMMARY OF THE INVENTION

According to the invention, a field effect transistor memory cell having selectable threshold voltage is provided. An n-channel electrically-erasable, electrically-programmable read-only memory cell is formed which includes a source and a drain separated by a channel, a tunneling window adjacent the drain, a floating gate and a control gate capacitively coupled to the channel through the floating gate. The n-channel EEPROM cell is operable to charge and discharge the floating gate by Fowler-Nordheim tunneling upon the application of voltages to the control gate and the drain. A p-channel field effect transistor is provided which includes a source and a drain spaced by a channel, a portion of the floating gate insulatively disposed adjacent the channel. The conductance of the channel is controlled by the floating gate. A threshold control circuit is provided for biasing the channel of the field-effect transistor in relation to the control gate. A monitoring circuit is also provided for controlling the application of voltage to the control gate in response to conduction between the source and drain of the p-channel field effect transistor.

The present invention provides significant advantages over the prior art. A memory cell with an uncharged floating gate may have its threshold voltage set to a predetermined value without having to completely charge the floating gate and then erasing back to the desired value. The present device employs the standard voltages used during the operation of the widely used n-channel EEPROM cells. Consistency problems with attempts to adjust the threshold value by changing the characteristics of the voltage pulses used to program a memory cell are eliminated. The present cell uses structure and materials readily used in conventional EE- PROM fabrication techniques. Finally, the ability to set the threshold voltage to any value within a specific range will allow the EEPROM cell to be used in various analog applications. Potential analog applications of the EEPROM cell with a write/erase mechanism to set the threshold voltage of the cell to a predetermined value include resistive ladders in a-d converters, and neural networks.

BRIEF DESCRIPTION OF THE DRAWINGS

Other aspects of the invention and their advantages will be discerned when one refers to the following detailed description as taken in conjunction with the drawings, in which.

c sectional view of an EEPROM

Figure 1:
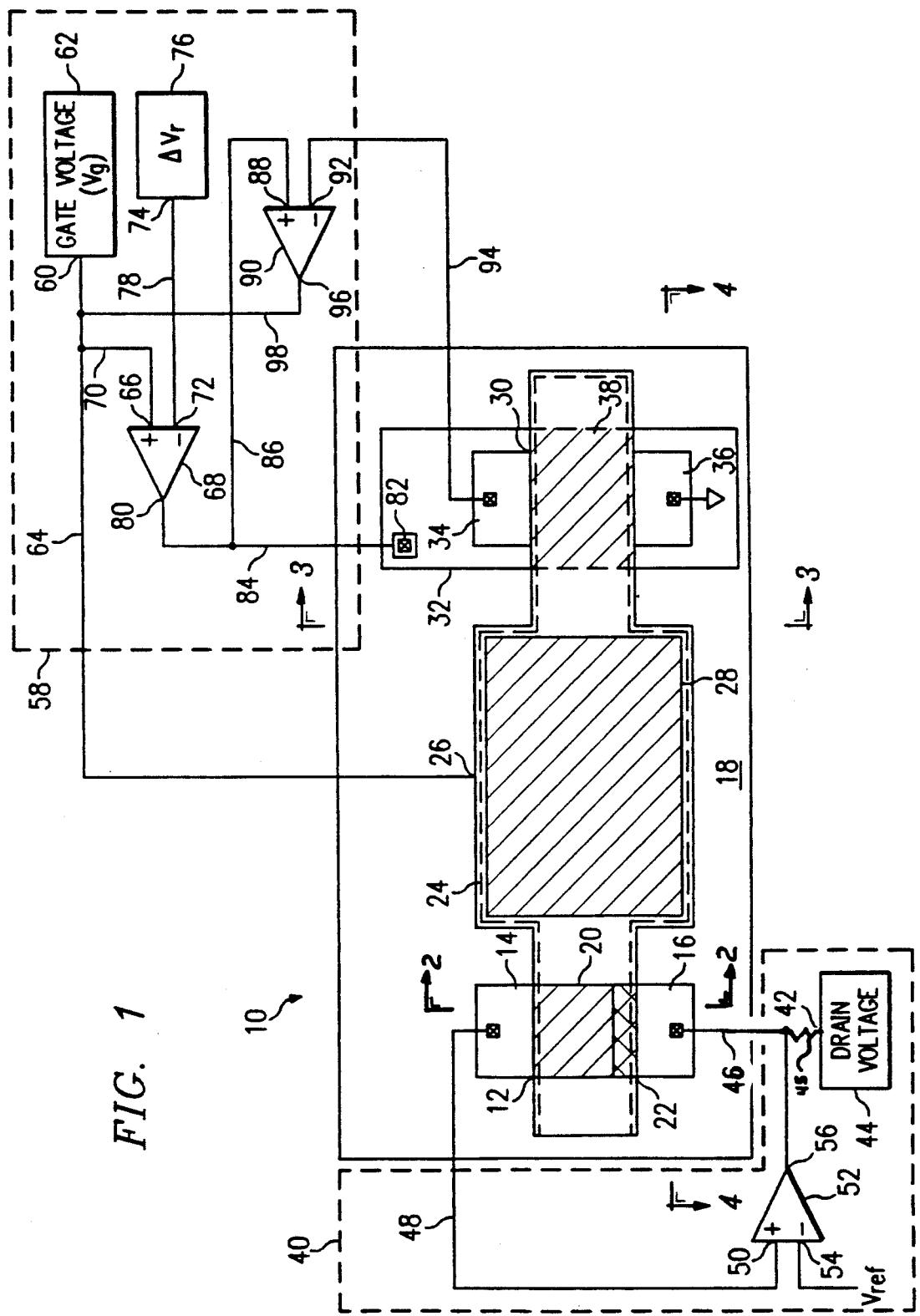
FIG. 1 is a schematic plan view of an electrically-erasable, electrically-programmable read-only memory (EEPROM) cell with a selectable threshold voltage according to the invention.
Figure 3:
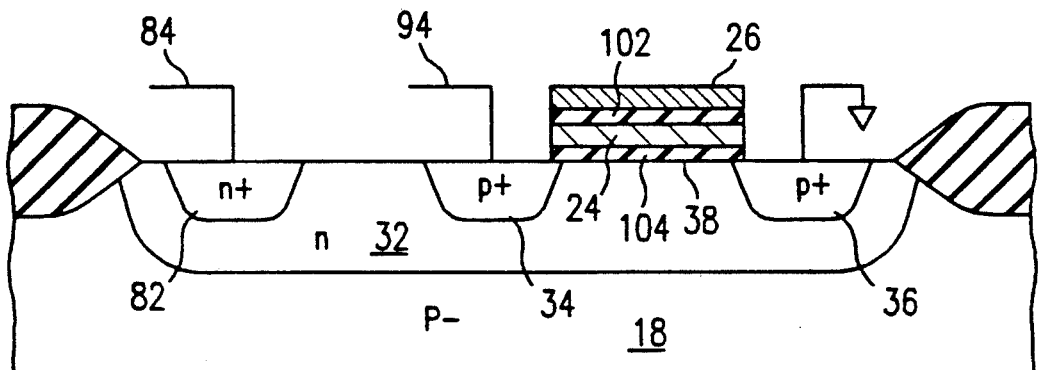
Figure 4:
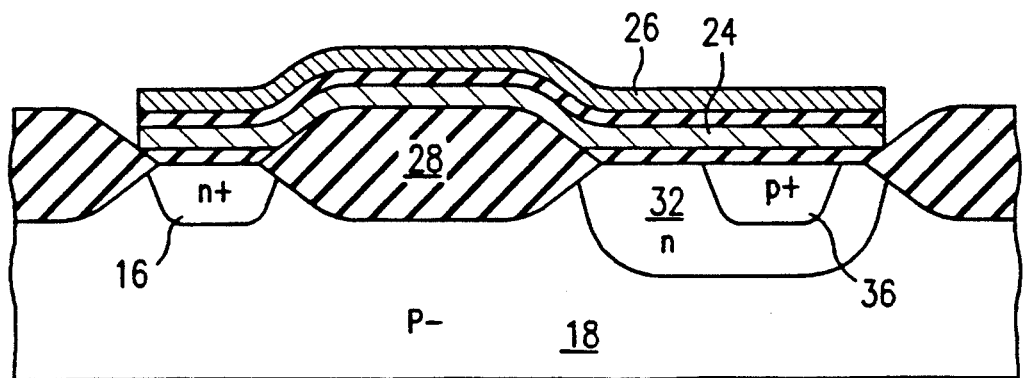
Figure 5:
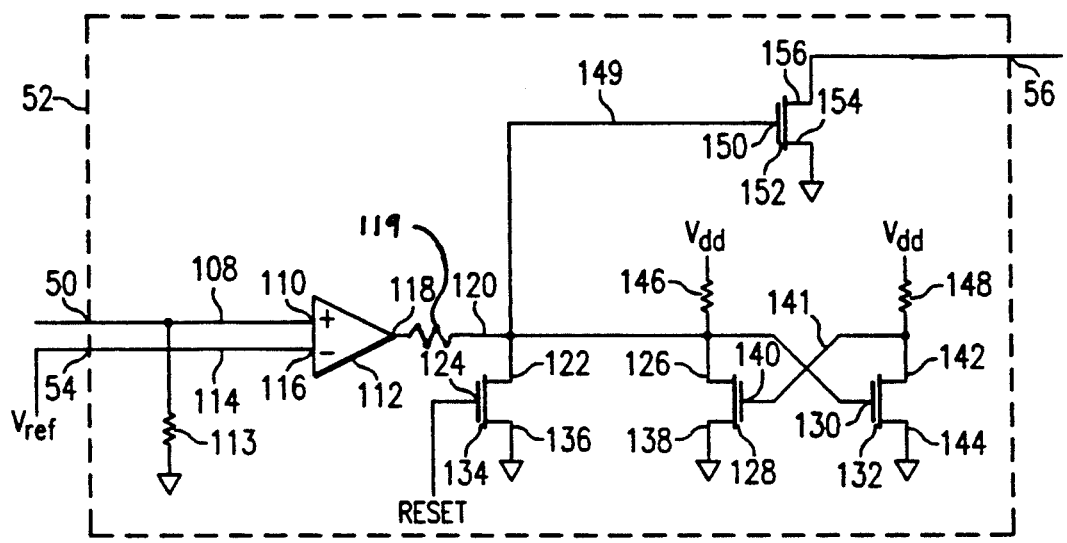
Figure 6:
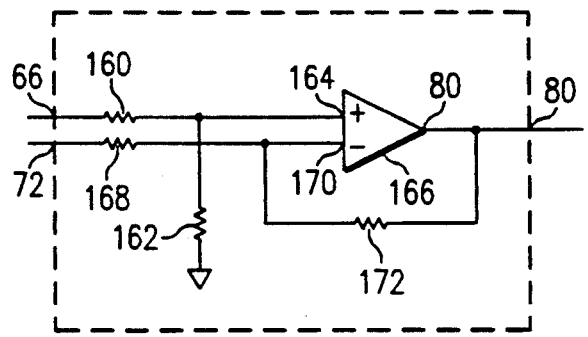
Figure 7:
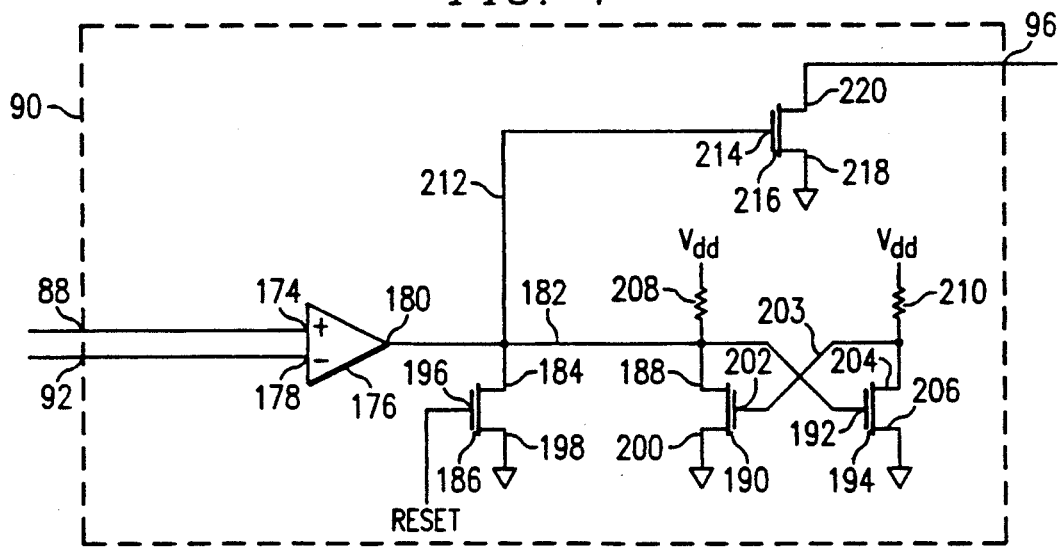

FIG. 3 is a schematic sectional view of an EEPROM cell according to the invention taken substantially along line 3—3 of FIG. 1;

FIG. 4 is a schematic sectional vieW of an EEPROM according to the invention taken substantially along line 4—4 of FIG. 1;

FIG. 5 is a detailed electrical schematic diagram of a first monitoring circuit portion as used in the embodiment shown in FIG. 1;

FIG. 6 is a detailed electrical schematic diagram of a second monitoring circuit portion as used in the embodiment shown in FIG. 1; and FIG. 7 is an electrical schematic diagram of a circuit portion of an EEPROM cell according to the invention.

DETAILED DESCRIPTION OF THE INVENTION

The preferred embodiment of the present invention is best understood by referring to FIGS. 1 through 7 of the drawings, like numerals being used for like and corresponding parts of the various drawings.

A plan view of an electrically-erasable, electrically-programmable read only memory cell with a controlled write/erase mechanism to set the threshold voltage to a desired value is shown generally at 10 in FIG. 1. An n−channel EEPROM cell 12 is formed by the diffusion of an n+ source region 14 and an n+ drain region 16 into an epitaxial layer 18. Source region 14 and drain region 16 are spaced by a channel area 20 (shown by diagonal hatching from the upper left to the lower right) of epitaxial layer 18. A thin oxide tunneling window 22 (illustrated by double crosshatching) is formed overlying channel region 20 adjacent drain region 16. A floating gate 24, the outline of which is indicated by a dotted line, is insulatively disposed over channel area 20 and disposed over tunneling window 22. A control gate 26 is insulatively disposed over floating gate 24. In a preferred embodiment shown in FIG. 1, floating gate 24 and control gate 26 extend over a thick oxide region 28 to increase the capacitive coupling area between floating gate 24 and control gate 26. (Lateral boundaries of control gate and floating gate are coextensive; shown offset only for clarity.)

A p-channel field effect transistor 30 is formed in a tank 32 of n-type material diffused into epitaxial layer 18. P-channel transistor 30 is formed by the diffusion of a p-type material into a source region 34 and a drain region 36. Source region 34 and drain region 36 are separated by a channel region 38 of n-tank 32. Floating gate 24 extends from n-channel EEPROM cell 12 to insulatively overlie and control channel area 38 of p-channel field effect transistor 30.

A first feedback circuit is shown generally by dotted lines at 40 in FIG. 1 for setting the threshold voltage $V_t$ of EEPROM cell 12 during an erase cycle. Output 42 of a drain voltage control circuit 44 is coupled by a contact to drain 16 of EEPROM cell 12 by a resistor 45 and a conductor 46. Source 14 of EEPROM cell 12 is coupled by a contact and conductor 48 to a non-inverting input 50 of an erase monitoring circuit 52. An inverting input 54 of erase monitoring circuit 52 is coupled to a reference voltage $V_{ref}$, while the output 56 is connected to output 42 of drain voltage control circuit 44.

A second feedback loop is shown by a dotted line generally at 58 for setting the threshold voltage of EEPROM cell 12 during a write (programming) cycle. Output 60 of gate voltage control circuitry 62 is coupled to control gate 26 by conductor 64. Output 60 of gate voltage control circuitry 62 is also connected to the non-inverting input 66 of a subtraction circuit 68 by conductor 70. The inverting input 72 of subtraction circuit 68 is connected to the output 74 of a threshold variation voltage control 76 by a conductor 78. Output 80 of subtraction circuit 68 is coupled to an n+ diffusion region 82 in tank 32 by conductor 84 and a contact. Output 80 of subtraction circuit 68 is also coupled by conductor 86 to the non-inverting input 88 of a write monitoring circuit 90. The inverting input 92 of monitoring circuit 90 is coupled by a conductor 94 and a contact to source region 34 of transistor 30. Output 96 is coupled by conductor 98 to output 60 of gate voltage control circuitry 62.

Figure 2:
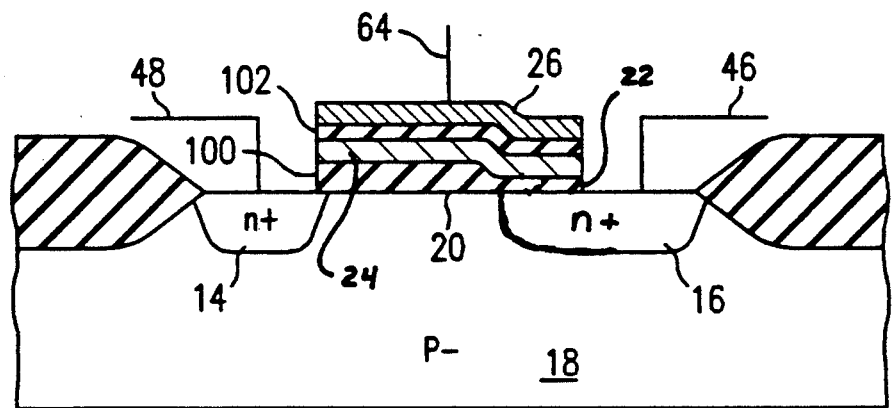
FIG. 2 is a greatly enlarged schematic elevational sectional view of an EEPROM cell with a selectable threshold voltage according to the invention taken substantially along line 2—2 of FIG. 1.

FIG. 2 shows a schematic cross-sectional view of EEPROM cell 12 as taken substantially along line 2—2 in FIG. 1. In FIG. 2, floating gate 24 is separated from channel region 20 by a gate oxide 100, and is adjacent thin oxide tunneling window 22. Floating gate 24 is insulated from the overlying control gate 26 by oxide layer 102.

FIG. 3 is a schematic cross-sectional view of field effect transistor 30 taken substantially along line 3—3 in FIG. 1. In FIG. 3, floating gate 24 is separated from channel region 38 by a gate oxide layer 104. Control gate 26 is separated from floating gate 24 by an oxide layer 102.

FIG. 4 depicts a schematic sectional elevational view taken substantially along line 4—4 of FIG. 1. FIG. 4 depicts oxide region 28 which is grown on substrate 18 using any one of a number of conventional methods. Oxide region 28 provides additional surface area over which control gate 26 and floating gate 24 can capacitively couple, and additionally, provides electrical isolation between transistor 12 and transistor 30. Oxide region 28 can be grown as a field oxide and used as a mask to self-align the implantation of n+ source/drain regions 14 and 16. The improved capacitive coupling allows a greater portion of the voltage applied to the control gate to be coupled onto the floating gate. The voltage applied to the control gate can thereby be reduced while retaining the same ability to control channel 20.

FIG. 5 is a schematic diagram of erase monitoring circuit 52 as shown in FIG. 1. Input 50 is coupled by a conductor 108 to non-inverting input 110 of an operational amplifier 12. A resistor 113 provides a current path between non-inverting input 110 and ground. Input 54 is coupled by a conductor 114 to inverting input 116 of operational amplifier 112. Output 118 of operational amplifier 112 is coupled through a resistor 119 a conductor 120 to the drain 122 of transistor 124, the drain 126 of transistor 128 and the gate 130 of transistor 132.

Transistor 124 provides for resetting erase monitoring circuitry 58. The gate 134 of transistor 124 is coupled to signal RESET, while the source 136 is grounded. Transistors 128 and 132 form a latch. Source 138 of transistor 128 is grounded while the gate 140 is coupled by conductor 141 to drain 142 of transistor 132. Source 144 of transistor 132 is grounded. A resistor 146 couples drain 126 of transistor 128 and gate 130 of transistor 132 to $V_{dd}$. A resistor 148 couples gate 140 of transistor 128 and drain 142 of transistor 132 to $V_{dd}$.

Output 118 of operational amplifier 112 is additionally coupled by conductor 149 to gate 150 of output transistor 152. The source 154 of transistor 152 is grounded while the drain 156 is coupled to output 56 of erase monitoring circuitry 52. Output transistor provides a gate to selectively ground the output of drain voltage control circuitry 44, thereby controlling the voltage applied to drain 16.

FIG. 6 depicts a preferred embodiment of the subtraction circuitry 68 shown in FIG. 1. Input 66 is coupled to a resistor 160 which is in turn coupled to a resistor 162 to form a voltage divider between input 66 and ground. The divided voltage is then provided to the non-inverting input 164 of an operational amplifier 166. Input 72 is coupled through a resistor 168 to the non-inverting input 170 of operational amplifier 166. The output of operational amplifier 166 represents the output of subtractor circuitry 68. Resistor 172 provides feedback from output 80 to inverting input 170 of 166.

FIG. 7 is an expanded schematic diagram of write monitoring circuitry 90 shown in FIG. 1. Input 88 represents the non-inverting input 174 of an operational amplifier 176. Input 92 represents the inverting input 178 of operational amplifier 176. Output 180 of operational amplifier 176 is coupled by a conductor 182 to the drain 184 of a transistor 186, the drain 188 of a transistor 190 and the gate 192 of a transistor 194.

Transistor 186 provides a reset means for write monitoring circuitry 90. Gate 196 of transistor 186 is tied to a reset signal RESET. The source 198 of transistor 186 is grounded.

Transistors 190 and 194 form a latch. The source 200 of transistor 190 is grounded while the gate 202 of transistor 190 is coupled by a conductor 203 to the drain 204 of transistor 194. Source 206 of transistor 194 is grounded. Drain 188 of transistor 190 is tied to $V_{dd}$ through a pull-up resistor 208 while the drain 204 of transistor 194 is tied to $V_{dd}$ through a pull-up resistor 210.

A conductor 212 couples the output 180 of operational amplifier 176 to gate 214 of an output transistor 216. The source 218 of transistor 216 is grounded while the drain 220 provides the output 96 for write monitoring circuitry 90.

The operation of the present invention can now be described in detail using FIGS. 1, 2 and 5 for reference. For convenience, the setting of the threshold voltage will first be described in the case when EEPROM cell 12 is already programmed to a logic "0", i.e., electrons are already residing on floating gate 24. The floating gate potential $V_F$ for a single conventional nonvolatile memory cell having a floating gate can be expressed as: Equation 1:

$$V_F = \frac{C_{pp}V_g + C_t(V_d - \phi_n) + C_d(V_d - \phi_{n'}) + C_c\phi_p + C_sV_s + Q_f}{\Sigma C_i}$$

where:
$\Sigma C_i = C_{pp} + C_t + C_d + C_c + C_{sub} + C_s$
$C_{pp}$=capacitance between floating gate 24 and control gate 26;
$C_t$=capacitance between floating gate 24 and tunnel 22;
$C_d$=capacitance between floating gate 24 and drain 16;
$C_{sub}$=capacitance between floating gate 24 and substrate 18;
$C_c$=capacitance between floating gate 24 and channel 20;
$C_s$=capacitance between floating gate 24 and source 14;
$\phi_p$=surface potential of channel 20;
$\phi_n$=surface potential of tunnel 22;
$\phi_{n'}$=surface potential of drain 16;
$Q_F$=charge on the floating gate 24;
$V_g$=voltage applied to control gate 26;
$V_d$=voltage applied to drain 16; and
$V_s$=voltage applied to source 14.
the surface potential of channel 20 will be determined by the floating gate potential $V_F$.

During a standard erase operation, control gate 26 of EEPROM cell 12 would be grounded, source 14 would be allowed to float, and drain 16 would be pulsed with an erase signal of about 16 volts for about 1-100 milliseconds by drain voltage control circuitry 44. At the beginning, the surface under the floating gate 24 would be in accumulation, such that the surface potential $\phi_p$ of channel 20 and the voltage on source 14, $V_s$, will be approximately zero volts.

As electrons are pulled out of floating gate 24, via Fowler-Nordheim tunneling through tunneling window 22, the floating gate potential $V_F$ will go up. The surface of channel region 20 will gradually come out of accumulation and go into depletion. Once the floating gate potential $V_F$ is high enough to deplete the silicon, the surface potential $\phi_p$ will start to rise as will the potential of source 14 which has been allowed to float. When the increase in potential of source 14 is detected in relation to the reference voltage $V_{ref}$ by monitoring circuitry 52, the voltage applied to drain 16 may be shunted by erase monitoring circuitry 52 to ground, preventing further erase. At this point, the voltage of floating gate 24 is approximately:

$$V_F \approx \frac{C_t(V_d - \phi_n) + C_d(V_d - \phi_{n'}) + Q_F}{C_{pp} + C_F + C_d + C_{sub} + C_s + C_c} \approx 0 \quad (2)$$

therefore, the charge on floating gate 24 is approximately:

$$Q_F = -C_t(V_d - \phi_n) - C_d(V_d - \phi_{n'}) \quad (3)$$

The threshold voltage $V_t$ will be:

$$V_t = V_{tn} - \frac{Q_F}{C_{pp}} \qquad (4)$$

where $V_{tn}$ is the threshold voltage of the cell in a neutral (completely uncharged) state.

To erase the EEPROM cell to a different threshold voltage $V'_t$, where $V'_t$ equals $V_t + \Delta V_t$, a gate bias voltage $V_g$ can be applied during erase using gate voltage control circuitry 62, where $V_g = \Delta V_t$. When the potential on source 14 starts to rise, the floating gate potential $V'_F$ will be:

$$V'_F = \frac{C_{pp}V_g + C_t(V_d - \phi_n) + C_d(V_d - \phi_{n'}) + Q_F}{C_{pp} + C_t + C_d + C_{sub} + C_s + C_c} \qquad (5)$$

Therefore, the charge on floating gate 24 will now become:

$$Q_F = -C_t(V_d - \phi_n) + C_d(V_d - \phi_{n'}) - C_{pp}V_g \qquad (6)$$

or:

$$Q_F = Q_F - C_{pp}V_g \qquad (7)$$

The threshold voltage $V_t$, will become:

$$V_t = V_{tn} - \frac{Q_F}{C_{pp}} = V_{tn} - \frac{Q_F}{C_{pp}} + V_g \qquad (8)$$

or:

$$V_t = V_t + V_g = V_t + \Delta V_t \qquad (9)$$

Thus, equation 10 shows that an EEPROM cell can be erased to any threshold voltage $V_t$, by applying an appropriate gate bias approximating the desired increase in threshold voltage $\Delta V_t$ to control gate 26 during the erase operation, using gate voltage control circuitry 62. When the potential source 14 beings to rise, monitoring circuitry 52 halts the application of voltage to drain 16, stopping erase with floating gate 24 partially charged, thereby leaving the threshold voltage at $V'_t$.

The main disadvantages of setting the threshold voltage during the erase cycle are slow speed and increased costs. When a positive gate bias is used the erase operation is slowed considerably. This speed disadvantage can be overcome by using a negative gate bias, however, generating the required negative voltages on the chip is significantly expensive.

The disadvantages of setting the threshold voltage of EEPROM cell 12 during the erase operation can be overcome by setting the threshold voltage during the write (programming) cycle. In this instance, transistor 30 operates cooperatively with EEPROM cell 12. In this case, during the write operation, while the floating gate 24 is being charged with electrons, the potential on floating gate 24 will be:

$$V_F = \frac{C_{pp}V_g + C_{NT}(V_{TANK}) + Q_F}{\Sigma C_i + C_{NT}} \qquad (10)$$

wherein, $C_{NT}$ = capacitance between floating gate 24 and tank 32;

$V_{TANK}$ = potential of tank 32.

When the potential of source 34 goes down as the floating gate 24 becomes charged:

$$V_F \approx V_{TANK} \approx \frac{C_{pp}V_q + C_{NT}(V_{TANK}) + Q_f}{\Sigma C_i + C_{NT}} \qquad (11)$$

therefore, the charge on the floating gate 24 becomes:

$$Q_F = V_{TANK}\Sigma C_i - V_g C_{pp} \qquad (12)$$

The threshold voltage can now be represented as:

$$V_t = V_{tN} - \frac{Q_f}{C_{pp}} = V_{tN} - \frac{V_{TANK}\Sigma C_i}{C_{pp}} + V_g \qquad (13)$$

where $V_{tN}$ is the threshold voltage of p-channel 38.

If the coupling of control gate 26 and floating gate 24 is improved by increasing the coupling area over oxide layer 28, then $C_{pp} \approx \Sigma C_i$. The threshold voltage becomes:

$$V_t \approx V_{tN} - V_{TANK} + V_g \qquad (14)$$

If the voltage on tank 32 approximates the difference between the control gate voltage $V_g$ and the desired change in threshold voltage $\Delta V_t$, i.e. $V_{TANK} \approx V_g - \Delta V_t$, then:

$$V_t \approx V_{tN} + V_t \qquad (15)$$

Thus, by properly biasing the n-tank 32 of transistor 30 with respect to control gate 26, the threshold voltage of EEPROM cell 12 can be set as follows during the write cycle.

Drain 16 of EEPROM cell 12 is grounded, while the source 14 is allowed to float. A high voltage of approximately 17 volts is applied to control gate 26, creating a high voltage differential between control gate 26 and drain 16. The voltage differential allows electrons to tunnel from drain 16 to floating gate 24 through tunneling window 22. As the electrons begin to reside on floating gate 24, the potential of floating gate 24 begins to go down.

Tank 32 of field transistor 30 has been biased to a voltage equal to the control gate voltage less the desired change in threshold voltage $(V_g - \Delta V_t)$ through the application of gate voltage $V_g$ by gate voltage control circuitry 62 and a threshold variation voltage $\Delta V_t$ by threshold variation circuitry 76 to subtraction circuit 68. Drain 34 of field effect transistor 30 has been grounded while source 36 has been allowed to float. Since transistor 30 is a p-channel device, while the potential of floating gate 24 remains sufficiently positive, i.e., the potential of the floating gate remains above the threshold voltage of the field effect transistor 30 as biased by the application of the bias voltage to tank 32, there is no conductance between drain 34 and source 36. When, however, a sufficient number of electrons have tunneled on to floating gate 24 and the potential of floating gate 24 has gone sufficiently negative, field effect transistor 30 turns on and a conductance path is created between drain 34 and source 36. Source 36 is thus clamped to the voltage on drain 34, which in this case is ground. When monitor circuit 90 detects the decrease in the potential on source 36 in relation to the voltage $V_g - \Delta V_t$ applied to tank 32, it shunts output 60 of gate voltage control circuitry 62 to ground, such that no voltage is applied to control gate 26. The charging of floating gate 24 is stopped at that point, effectively setting the threshold voltage of EEPROM cell 12 to a voltage proportionate to the amount of charge already allowed to tunnel to floating gate 24.

The threshold voltage of EEPROM cell 12 can thus be set to any value within the range defined by the threshold voltage when floating gate 24 is not charged, and a voltage proportionate to the maximum charge which can be accumulated on floating gate 24. The disadvantages of setting the threshold voltage during the erase cycle are thereby eliminated. Further, in the present invention, the threshold voltage may optionally be applied during the erase or the write cycle, such that the user may start the operation of setting the threshold with either a charged or uncharged floating gate.

Although the present invention has been described in detail, it should be understood that various changes, substitutions and alterations can be made herein without departing from the spirit and scope of the invention as defined by the appended claims.

What is claimed is:

1. An electrically-erasable, electrically-programmable read only memory cell, with a write controllable threshold voltage, formed in a semiconductor layer of a first conductivity type, comprising:
   a first transistor, source and drain regions of said first transistor formed in said semiconductor layer to be of a second conductivity type opposite said first conductivity type, a channel area of said first transistor in said semiconductor layer spacing said source region from said drain region;
   a tank region formed in said semiconductor layer spaced from said first transistor and formed to be of said second conductivity type;
   a second transistor, a source and a drain region of said second transistor formed in said tank region to be of said first conductivity type, a channel area of said second transistor in said tank region spacing said source region in said second transistor from said drain region of said second transistor;
   a floating gate having a first portion insulatively adjacent said channel area of said first transistor, and a second portion insulatively adjacent said channel area of aid second transistor, and operable to control the threshold voltages of said channel areas upon the application of a predetermined voltage to the floating gate;
   a control gate insulatively disposed adjacent said floating gate, said control gate operable to control the charging of said floating gate upon the application of preselected voltages to said drain of said first transistor and said control gate;
   a voltage source for providing a voltage level to said control gate sufficient to increase the charge stored in said floating gate;
   a threshold control circuit coupled to vary the potential of said tank in relation to said control gate; and
   a monitoring circuit coupled to control the application of said voltage level to said control gate in response to a change in potential on said source of said second transistor and such that the charge on said floating gate stops increasing when a selected threshold voltage of said channel area of said second transistor is obtained, said selected voltage within a range defined by the threshold voltage when said floating gate is not charged, and a voltage proportionate to the maximum charge which can be accumulated on said floating gate.

2. The cell of claim 1, and further comprising a Fowler-Nordheim tunneling window disposed adjacent said drain of said first transistor.

3. The cell of claim 1, wherein said first conductivity type is p-type material, said second conductivity type being n-type material.

4. The cell of claim 1, wherein said monitoring circuit is a differential operational amplifier circuit operable to measure the voltage difference between said tank and said source of said second transistor.

5. The cell of claim 1, wherein said threshold control circuit is operable to bias said tank to a value equal to the control gate voltage less a preselected desired change in threshold value of the cell.

6. An electrically-erasable, electrically-programmable read-only memory cell including apparatus for setting the threshold voltage of said cell during a preselected one of a writing cycle and an erasing cycle of said cell, comprising:
   a layer of semiconductor of a first conductivity type;
   a first transistor formed in said layer of semiconductor, a source region and a drain region of said transistor formed in said layer to be of a second conductivity type opposite said first conductivity type, a channel area spacing said source region from said drain region, a thin oxide tunneling window formed on said channel area adjacent said drain region;
   a tank region of said second conductivity type formed in said layer;
   a second transistor formed in said tank opposite said first conductivity type, and spaced from said first transistor and including a source region and a drain region spaced by a channel region, said source and drain regions formed to be of said first conductivity type;
   a floating gate having a first portion insulatively overlaying said channel of said first transistor and a second portion insulatively overlaying said channel of said second transistor;
   a control gate insulatively disposed adjacent said floating gate and operable to charge and discharge said floating gate by Fowler-Nordheim tunneling through said tunneling window upon the application of preselected voltages to said control gate and said drain of said first transistor;
   first circuitry operable to control the discharge of said floating gate, comprising:
     drain voltage control circuitry for applying voltage to said drain of said first transistor;
     a first monitoring circuit for monitoring the potential of said source of said first transistor, said first monitoring circuitry operable to halt the application of voltage by said drain voltage control circuitry in response to a change in potential of said source of said first transistor; and
   second circuitry operable to control the charging of said floating gate, comprising:
     threshold control circuitry coupled to said tank and operable to bias said tank in relation to said control gate;
     gate voltage control circuitry coupled to said control gate and operable to apply a voltage to said control gate sufficient to increase the charge stored in said floating gate; and
     a second monitoring circuit coupled to said gate voltage control circuitry for monitoring the potential of said source of said second transistor in relation to said tank, said second monitoring circuit operable to halt the application of voltage to said control gate by said gate voltage control circuitry in response to a change in potential of said source of said second transistor in relation to the potential of said control gate said first and second circuitry operable to set a selected threshold voltage of the memory cell within a range defined by the threshold voltage when said floating gate is not charged, and a voltage proportionate to the maximum charge which can be accumulated on said floating gate.

7. The apparatus of claim 6, wherein the source and drain of said first transistor are formed of n-type material and said source and said drain of said second transistor are formed of p-type material.

8. The apparatus of claim 7, and further comprising a thick oxide region separating said first and second transistors.

9. The apparatus of claim 6, wherein a third portion of said floating gate having a relatively large surface area capacitively couples with a co-extensive portion of said control gate.

10. The apparatus of claim 9, wherein said floating gate and said control gate couple over a surface area provided by said thick oxide region.

11. The apparatus of claim 6, wherein said first and second monitoring circuits are differential amplifier circuits using operational amplifiers.

12. A method for setting the threshold voltage of an electrically-erasable, electrically-programmable read only memory cell, including a first transistor having a source and a drain separated by an n-channel, a floating gate insulatively overlying the channel, a tunneling window disposed in the channel adjacent the drain, and a control gate insulatively overlying the floating gate, and a second transistor having a source and drain separated by a p-channel, the n-channel being controlled by the floating gate of the first transistor, comprising the steps of:

applying a drain write voltage to the drain of the first transistor, applying a control gate write voltage to the control gate of the first transistor;

responsive to said steps applying write voltages, causing electrons to flow from the drain of the first transistor to the floating gate via Fowler-Nordheim tunneling;

grounding the drain of the second transistor;

allowing the source of the second transistor to float;

biasing the channel of the second transistor to preselect a threshold voltage selected within a range defined by the threshold voltage when said floating gate is not charged, and a voltage proportionate to the maximum charge which can be accumulated on said floating gate;

monitoring the potential of the source of the second transistor; and in response to said step of monitoring, halting the application of voltage to the control gate of the first transistor when the voltage on the source of the second transistor decreases.

13. The method of claim 12, wherein said step of biasing the channel of the second transistor comprises the application of a positive voltage to increase the threshold voltage of the cell.

14. The method of claim 13, wherein the positive voltage is applied to a tank formed in a substrate and in which the second transistor is formed.

15. The method of claim 12, wherein the voltage applied to the tank is equal to the gate write voltage less the desired change in threshold voltage of the cell.

* * * * *